(12) United States Patent
Ishikawa et al.

(10) Patent No.: US 11,069,836 B2
(45) Date of Patent: Jul. 20, 2021

(54) METHODS FOR GROWING LIGHT EMITTING DEVICES UNDER ULTRA-VIOLET ILLUMINATION

(71) Applicant: Lumileds LLC, San Jose, CA (US)

(72) Inventors: Tsutomu Ishikawa, San Jose, CA (US); Isaac Wildeson, San Jose, CA (US); Erik Charles Nelson, Pleasanton, CA (US); Parijat Deb, San Jose, CA (US)

(73) Assignee: LUMILEDS LLC, San Jose, CA (US)

( * ) Notice: Subject to any disclaimer, the term of this patent is extended or adjusted under 35 U.S.C. 154(b) by 0 days.

(21) Appl. No.: 16/717,052

(22) Filed: Dec. 17, 2019

(65) Prior Publication Data

US 2020/0127166 A1  Apr. 23, 2020

Related U.S. Application Data

(62) Division of application No. 15/793,723, filed on Oct. 25, 2017, now Pat. No. 10,541,352.
(Continued)

(30) Foreign Application Priority Data

Dec. 15, 2016  (EP) .................................. 16204234

(51) Int. Cl.
*H01L 33/32* (2010.01)
*H01L 21/268* (2006.01)
(Continued)

(52) U.S. Cl.
CPC ............ *H01L 33/32* (2013.01); *C23C 16/303* (2013.01); *C23C 16/482* (2013.01);
(Continued)

(58) Field of Classification Search
CPC ........................ H01L 21/0254; H01L 33/0062
See application file for complete search history.

(56) References Cited

U.S. PATENT DOCUMENTS

| 8,039,352 B2 | 10/2011 | Mishra et al. |
| 2002/0187568 A1 | 12/2002 | Stockman |

(Continued)

FOREIGN PATENT DOCUMENTS

| CN | 104638070 A | 5/2015 |
| EP | 1255291 A2 | 11/2002 |

(Continued)

*Primary Examiner* — Farun Lu
(74) *Attorney, Agent, or Firm* — Servilla Whitney LLC

(57) ABSTRACT

Described herein are methods for growing light emitting devices under ultra-violet (UV) illumination. A method includes growing a III-nitride n-type layer over a III-nitride p-type layer under UV illumination. Another method includes growing a light emitting device structure on a growth substrate and growing a tunnel junction on the light emitting device structure, where certain layers are grown under UV illumination. Another method includes forming a III-nitride tunnel junction n-type layer over the III-nitride p-type layer to form a tunnel junction light emitting diode. A surface of the III-nitride tunnel junction n-type layer is done under illumination during an initial period and a remainder of the formation is completed absent illumination. The UV light has photon energy higher than the III-nitride p-type layer's band gap energy. The UV illumination inhibits formation of Mg—H complexes within the III-nitride p-type layer resulting from hydrogen present in a deposition chamber.

6 Claims, 8 Drawing Sheets

Related U.S. Application Data

(60) Provisional application No. 62/414,612, filed on Oct. 28, 2016.

(51) Int. Cl.
*H01L 21/02* (2006.01)
*C23C 16/48* (2006.01)
*H01L 33/00* (2010.01)
*C23C 16/30* (2006.01)
*H01L 33/06* (2010.01)
*H01L 33/02* (2010.01)

(52) U.S. Cl.
CPC ...... *H01L 21/0254* (2013.01); *H01L 21/0262* (2013.01); *H01L 21/02458* (2013.01); *H01L 21/02579* (2013.01); *H01L 21/2686* (2013.01); *H01L 33/0062* (2013.01); *H01L 33/0075* (2013.01); *H01L 33/0095* (2013.01); *H01L 33/06* (2013.01); *H01L 33/025* (2013.01)

(56) References Cited

U.S. PATENT DOCUMENTS

| | | | | |
|---|---|---|---|---|
| 2008/0116476 A1* | 5/2008 | Komada | ............ | H01L 33/32 257/103 |
| 2008/0217646 A1* | 9/2008 | Komada | ............ | H01L 33/04 257/101 |
| 2011/0278641 A1 | 11/2011 | Grolier et al. | | |
| 2017/0032974 A1* | 2/2017 | Armour | ............ | C23C 16/047 |

FOREIGN PATENT DOCUMENTS

| | | |
|---|---|---|
| JP | 3771987 B2 | 5/2006 |
| KR | 20050123422 A | 12/2005 |

* cited by examiner

METHODS FOR GROWING LIGHT EMITTING DEVICES UNDER ULTRA-VIOLET ILLUMINATION

CROSS REFERENCE TO RELATED APPLICATIONS

This application is a Divisional Application of U.S. application Ser. No. 15/793,723, filed on Oct. 25, 2017, which claims the benefit of U.S. Provisional Application No. 62/414,612 filed on Oct. 28, 2016 and European Provisional Application No. 16204234.5 filed on Dec. 15, 2016, the contents of which are hereby incorporated by reference herein as if fully set forth.

FIELD OF INVENTION

This application is related to light emitting devices.

BACKGROUND

Semiconductor light-emitting devices including light emitting diodes (LEDs), resonant cavity light emitting diodes (RCLEDs), vertical-cavity surface-emitting laser (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials.

Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions.

In commercial III-nitride LEDs, the semiconductor structure is typically grown by MOCVD. The nitrogen source used during MOCVD is typically ammonia. When ammonia dissociates, hydrogen is produced. The hydrogen forms a complex with magnesium, i.e., a Mg—H complex, which is used as the p-type dopant during growth of p-type materials. The hydrogen complex deactivates the p-type character of the magnesium, effectively reducing the active dopant (and hole) concentration of the p-type material, which reduces the efficiency of the device. After growth of the p-type material, the structure is annealed in order to break the hydrogen-magnesium complex by driving off the hydrogen.

SUMMARY

Described herein are methods for growing light emitting devices under ultra-violet (UV) illumination. A method includes growing a III-nitride n-type layer over a III-nitride p-type layer in the presence of UV light. Another method includes growing a light emitting device structure on a growth substrate and growing a tunnel junction on the light emitting device structure, where certain layers are grown under UV illumination. Another method includes establishing of forming a III-nitride tunnel junction n-type layer over the III-nitride p-type layer to form a tunnel junction light emitting diode. A surface of the III-nitride tunnel junction n-type layer is illuminated with light during an initial period and then a remainder of the formation is completed absent light illumination. The UV light has a photon energy higher than the III-nitride p-type layer's band gap energy. The UV illumination inhibits formation of Mg—H complexes within the III-nitride p-type layer resulting from hydrogen present in a deposition chamber.

BRIEF DESCRIPTION OF THE DRAWINGS

A more detailed understanding may be had from the following description, given by way of example in conjunction with the accompanying drawings wherein.

DETAILED DESCRIPTION

It is to be understood that the figures and descriptions for methods for growing light emitting devices under ultra-violet illumination have been simplified to illustrate elements that are relevant for a clear understanding, while eliminating, for the purpose of clarity, many other elements found in typical device processing. Those of ordinary skill in the art may recognize that other elements and/or steps are desirable and/or required in implementing the present invention. However, because such elements and steps are well known in the art, and because they do not facilitate a better understanding of the present invention, a discussion of such elements and steps is not provided herein.

In conventional III-nitride light emitting diodes (LEDs), a n-type layer is grown first on a substrate, followed by an active layer (or light emitting layer) and a p-type layer. As used herein, the term layer refers to at least one layer of the identified layer, e.g. p-type layer or n-type layer can include one or more p-type or n-type layers, respectively. For example, a n-type gallium nitride (GaN) is grown over a growth substrate such as sapphire, a multi-quantum well (MQW) active layer is then grown over the n-type GaN layer and a p-type GaN layer is grown over the active layer. A more heavily doped p+ GaN layer is grown over the p-type GaN layer for obtaining good ohmic contact to an anode electrode. For vertical LEDs with a top electrode and a bottom electrode, a transparent conductor layer, (e.g., indium tin oxide (ITO) or a very thin gold layer), may be optionally deposited over the p+ GaN layer for current spreading, followed by depositing one or more small metal anode electrodes over the transparent conductor layer. A carrier wafer is then affixed to the top surface, and the growth substrate is removed, such as by laser lift-off. The "bottom" n-type GaN layer is then thinned, and a reflective metal cathode electrode is deposited on the n-type GaN layer for ohmic contact. After the LED dies are singulated from the wafer and packaged, a positive voltage is applied to the anode electrode and a negative voltage is applied to the cathode electrode for energizing the LED, where most of the light exits through the top p+ GaN layer.

An issue with such a conventional LED is that the opaque anode electrodes and the ITO current spreading layer somewhat block and attenuate the light output, and the sheet resistance of the thin ITO layer is significant. Adding more metal for better current spreading blocks even more light. Additionally, it is difficult to form a heavily doped p+ GaN layer (as the top layer) for good ohmic contact with the anode electrode.

Figure 1:
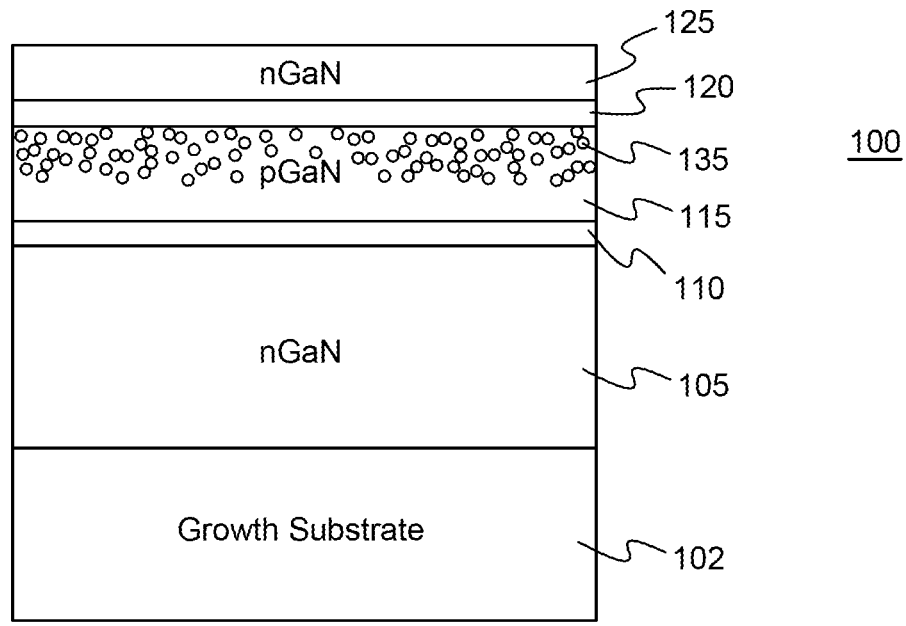
FIG. 1 is a cross-sectional view of a tunnel junction light emitting device (TJ LED) illustrating hydrogen atoms in p-type GaN layers bonding with the Mg dopants and preventing activation of the Mg dopants with a conventional anneal process.
Figure 2:
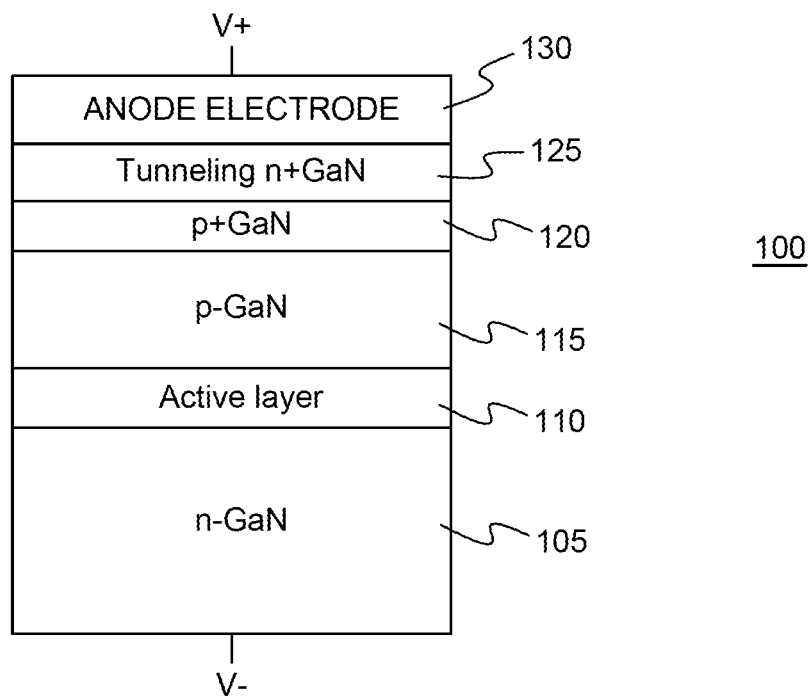
FIG. 2 is an illustrative diagram of the TJ LED showing how a tunnel junction n+ GaN layer and the p+ GaN layer are reversed biased, yet conduct tunnel current, while the TJ LED is energized.

An alternative to such a conventional design is to fabricate a tunnel junction LED (TJ LED) 100 as shown in FIGS. 1 and 2. A tunnel junction is a structure that allows electrons to tunnel from the valence band of a p-type layer to the conduction band of an n-type layer in reverse bias. When an electron tunnels, a hole is left behind in the p-type layer, such that carriers are generated in both layers. Accordingly, in an electronic device like a diode, where only a small leakage current flows in reverse bias, a large current can be carried in reverse bias across a tunnel junction. A tunnel junction requires a particular alignment of the conduction and valence bands at the p/n tunnel junction This can be achieved by using very high doping (e.g., in the p++/n++ junction). In addition, III-nitride materials have an inherent polarization that creates an electric field at heterointerfaces between different alloy compositions. This polarization field can also be utilized to achieve the required band alignment for tunneling.

Referring to FIGS. 1 and 2, TJ LED 100 includes an n-type GaN layer 105, active layer 110, p-type GaN layer 115 and p+ GaN layer 120 grown over a sapphire substrate 102. A n+ GaN layer 125 is grown over p+ GaN layer 120, which establishes, forms, results or causes (collectively "establishes") p+ GaN layer 120 and n+ GaN layer 125 to be tunnel junction layers and such terminology will be used herein when appropriate to distinguish between non-tunnel junction layers and tunnel junction layers. For example, in the instance of FIG. 1, n+ GaN layer 125 and p+ GaN layer 120 may be referred to as tunnel junction n+ GaN layer 125 and tunnel junction p+ GaN layer 120, when appropriate or applicable. An anode electrode 130 is then formed over n+ GaN layer 125 as shown in FIG. 2. Anode electrode 130 may be metal or other similar materials. Ohmic contact between a metal electrode and an n+ GaN layer is typically better than the ohmic contact between a metal electrode and a p+ GaN layer. Further, the sheet resistance of n+ GaN layer 125 is lower than that of the typical transparent conductor used for current spreading and typically lower than that of a p+ GaN layer 120. Since n+ GaN layer 125 and p+ GaN layer 120 are highly doped and the depletion layer is very thin, electrons can tunnel through the junction even though the junction is reversed biased. As a result, n+ GaN layer 125 efficiently spreads the LED current from anode electrode 130 with very little light attenuation. The tunnel junction adds a slightly higher forward voltage drop to the LED, but since the light output is increased, the efficiency of TJ LED 100 may be higher than that of a conventional LED. Further, the tunnel junction allows TJ LED 100 to be driven at a lower current for the same light output as a conventional LED, enabling TJ LED 100 to operate at its peak efficiency.

Figure 3:
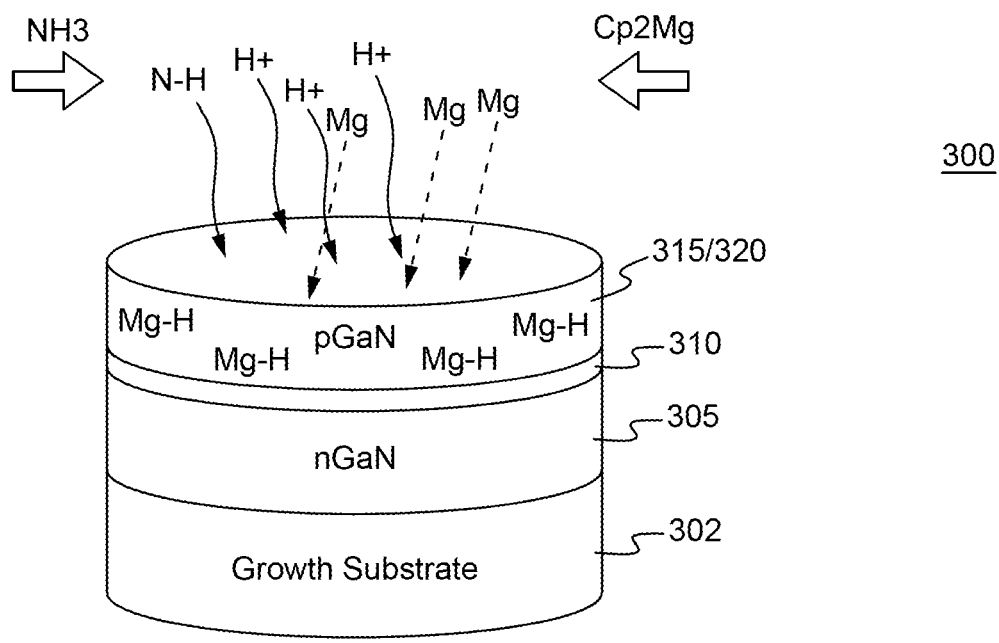
FIG. 3 illustrates a TJ LED wafer during the growth of the p-type GaN layers, where hydrogen impurities are introduced into the p-type GaN layers and bond with the Mg dopants to prevent activation of the Mg dopants and limit the effective p-type doping of the p-type GaN layers.

One problem with such TJ LEDs is that p-type GaN layers are buried under a tunnel junction n+ GaN layer 125. Consequently, during an annealing process to diffuse out hydrogen atoms 135 from p-type GaN layer 115 and p+ GaN layer 120, hydrogen atoms 135 are trapped. This is illustrated in FIG. 3, where a device 300 is grown using ammonia (NH$_3$) as the nitrogen source in a metalorganic chemical vapor deposition (MOCVD) chamber, resulting in N and H incorporation into the p-type layers (shown as pGaN layers 315 and 320). Device 300 includes, for example, a n-type GaN layer 305, active layer 310, p-type GaN layer 315 and p+ GaN layers 315 and 320 grown over a sapphire substrate 302. The hydrogen atoms are incorporated into p-type GaN layers 315 and 320 lattice as an inherent result of the p-type GaN growing process, where the "p-type" Mg dopants and hydrogen atoms bond to form Mg—H complexes. The Mg dopants are introduced into the MOCVD chamber as cyclopentadienyl magnesium (Cp2Mg) gas. The Mg dopants cannot be activated until the hydrogen atoms are removed by the anneal step. Since hydrogen atoms do not diffuse through n-type GaN, it is difficult to form a TJ LED.

Other approaches have been used, but each such technique has issues. For example, molecular beam epitaxy (MBE) has been used to grow p-type GaN layers with less imbedded hydrogen but such an MBE process is slow and expensive. Another approach forms trenches down to the p-type GaN layer and then anneals to laterally diffuse out the hydrogen atoms; however, such a technique adds significant complexity. In addition, significantly increasing the anneal temperature to diffuse out the hydrogen laterally may thermally damage the TJ LED. Although the above issues are described with respect to TJ LEDs, it is also applicable when the p-type GaN layer is first grown over the substrate followed by growing the active layer and the n-type GaN layer. In general, these issues are present with flip chip LEDs as well as vertical LEDs. In particular, these issues exists with flip chip LEDs which use tunnel junction n+ GaN layers between the p-type GaN layers and the anode electrode, where the n-type anode layer is used to better spread current.

Therefore, techniques are needed for fabricating a TJ LED using an MOCVD process where fewer Mg—H complexes result and no (extensive) anneal is needed to activate the Mg dopants to create p-type GaN layers.

Described herein are methods for growing light emitting devices under ultra-violet (UV) illumination. In general, an MOCVD chamber is customized to have a window that allows externally-generated UV light to illuminate the top of the wafer in-situ. The UV light illuminates the wafer at least during the growth of the p-type GaN layers and mitigates formation of Mg—H complexes. Impurity and point defect incorporation in the p-type GaN layers during epitaxial growth are influenced by the Fermi level effect. UV light, having a photon energy higher than the p-type GaN's band gap energy, generates minority carriers, which temporarily change the p-type GaN's Fermi level energy during growth. Consequently, hydrogen incorporation and other point defect generation during the p-type GaN growth can be suppressed, resulting in fewer Mg—H complexes in the p-type GaN layer.

Example methods are provided where a TJ LED is illuminated by UV light in the MOCVD chamber during the growth of the p-type GaN layers and/or tunnel junction n+ GaN layer. The methods described herein eliminate the need for aggressive ex-situ thermal annealing to remove hydrogen from a buried p-GaN layer in a TJ LED, for example. Since there are fewer hydrogen impurities, more of the Mg dopants in the p-type GaN layers are already activated, allowing an activation anneal to be eliminated altogether. In another implementation, an activation anneal can be performed in-situ, while the wafer is illuminated with UV light, prior to and/or during the formation of an overlying tunnel junction n+ GaN layer.

In a general example TJ LED method, the layers grown prior to growing the top tunnel junction n+ GaN layer are not illuminated by the UV light during growth. Prior to the tunnel junction n+ GaN layer being grown, an out-gassing anneal is performed in-situ, while the growth surface of the wafer is optionally illuminated by UV light, to remove most of the hydrogen from the p-type GaN layers. Then the activation anneal is ceased, and the tunnel junction n+ GaN layer is grown while being illuminated by the UV light. This prevents hydrogen in the tunnel junction n+ GaN layer from diffusing into the top p+ GaN layer and forming Mg—H complexes near the tunnel junction. After partial growth of the n+ GaN, the UV light may be turned off (since new H atoms can no longer diffuse into the p-type GaN layers) and the remainder of the tunnel junction n+ GaN layer is grown.

The described methods can be used to prevent Mg—H complex formation when forming devices where p-type GaN layers are first grown over the growth substrate. An active layer and n-type GaN layers are then grown over the p-type GaN layers, resulting in buried p-type GaN layers. The methods can also be used when multiple LEDs are grown over each other to create a serial string of LEDs in a single die.

Figure 4:
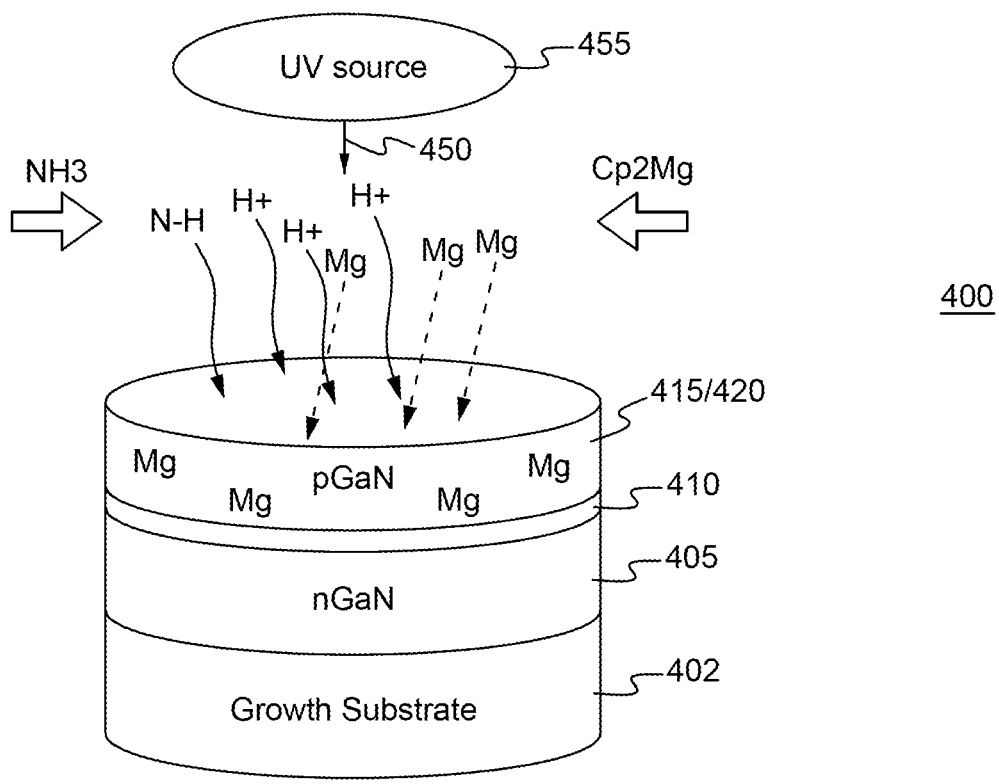
FIG. 4 is an illustrative diagram for growing specific layers in a device in the presence of ultra-violet (UV) illumination in accordance with certain implementations.

FIG. 4 is an illustrative diagram for growing specific layers in a device 400 in the presence of ultra-violet (UV) illumination in accordance with certain implementations. Device 400 includes an epitaxially grown n-type GaN layer 405 and active layer 410 over a substrate 402 of a wafer. For example, the epitaxial growth can be done in an MOCVD chamber. N-type GaN layer 405 can be multiple layers and can include, but is not limited to, a nucleation layer and layers for providing lattice matching, for example. Active layer 410 can be, but is not limited to, a multi-quantum well (MQW) layer, for example. Device 400 can emit at a variety of wavelengths and frequencies, such as for example, blue light.

Device 400 further includes p-type GaN layer 415 and p+ GaN layer 420 epitaxially grown over active layer 410. In an implementation, at least during the time that p-type GaN layer 415 and/or p+ GaN 420 is epitaxially grown by introducing $NH_3$ (and possibly $H_2$) and Cp2Mg gases into the MOCVD chamber, UV light 450 from a suitable UV source 455 is introduced via a window in the MOCVD chamber to illuminate the growth surface of the wafer. In an implementation, the power of UV light 450 may range from 0.05 W/cm2 to 50 W/cm2. In another implementation, the power of UV light 450 may range from 1 W/cm2 to 10 W/cm2. In an implementation, any light source generating photons with energy higher than the p-type GaN layer's 415 band gap energy is sufficient.

As described herein above, a conventional MOCVD process for forming GaN based LEDs uses ammonia ($NH_3$) as the nitrogen source. The $NH_3$ decomposes at the growth temperature into hydrogen radicals and active forms of nitrogen. The hydrogen from the ammonia decomposition, in conventional processes as shown in FIG. 3, forms a complex with the Mg during growth, (shown as Mg—H complexes in FIG. 3). Hydrogen and Mg impurity incorporation in the GaN film can be influenced by the Fermi level effect. For example, when Mg is incorporated into GaN, the Fermi level shifts away from the Fermi level stabilization energy and toward the valence band of GaN since Mg is an acceptor in GaN. Hydrogen incorporation increases as the Fermi level shifts closer to the valence band, and compensates the Mg in the lattice, making the Mg electrically inactive, which in turn moves the Fermi level away from the valence band and back closer to the stabilization energy. Consequently, there is an equilibrium Fermi energy level achieved during conventional MOCVD p-type GaN growth that is below the stabilization energy and results in a high concentration of electrically inactive Mg—H complexes. This issue with conventional processes requires a high temperature ex-situ anneal to out-diffuse the hydrogen, which is a problem in TJ LEDs due to the buried p-GaN layers as previously described.

However, when UV light 450, with a photon energy above the p-type GaN band gap energy, illuminates p-type GaN layer 415 and/or p+ GaN layer 420 surface during growth, the minority carriers generated by absorbing UV light 450 shift the Fermi level closer to the stabilization energy without involving hydrogen incorporation. Consequently, no or fewer Mg—H complexes are formed in p-type GaN layer 415 and/or p+ GaN layer 420. As a result, p-type GaN layer 415 and/or p+ GaN layer 420 do not require any subsequent activation step to diffuse out the hydrogen.

Figure 5:
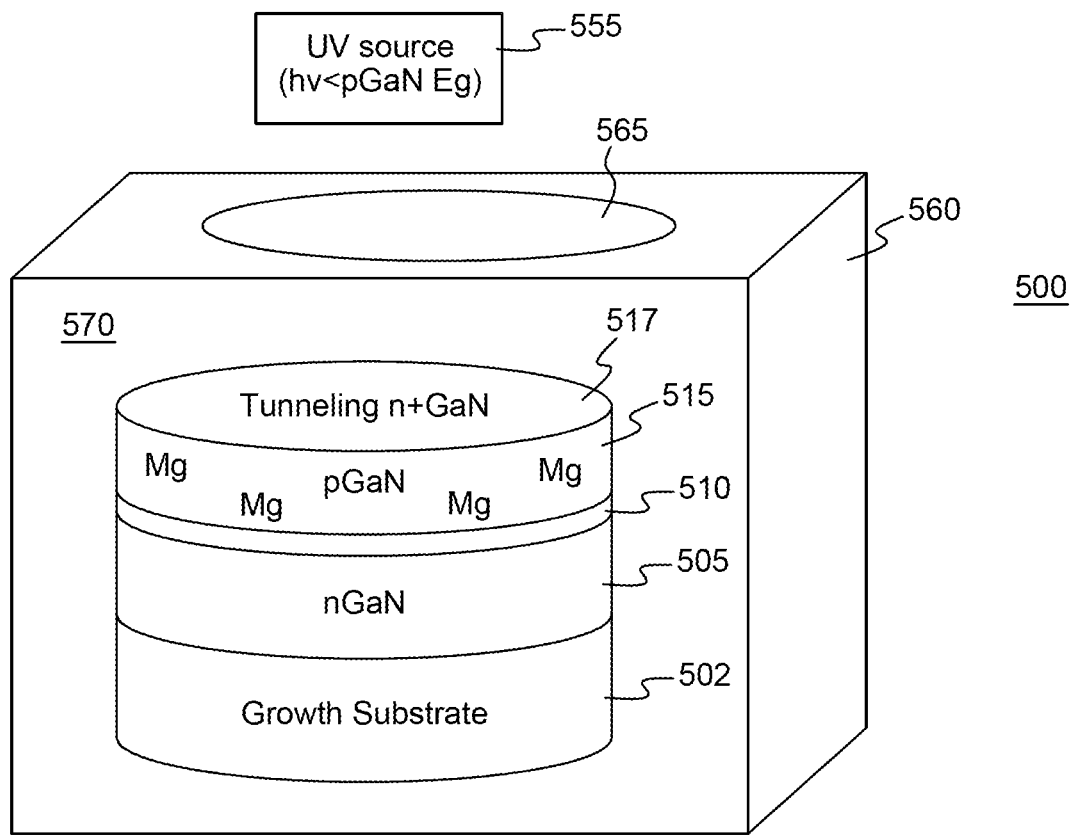
FIG. 5 is an illustrative metalorganic chemical vapor deposition (MOCVD) chamber with a window for UV illumination in accordance with certain implementations.

FIG. 5 is an illustrative metalorganic chemical vapor deposition (MOCVD) chamber 560 with a window 565 for UV illumination into MOCVD chamber's 560 deposition chamber 570 in accordance with certain implementations. Window 565 permits UV light from UV source 555 to illuminate the growth surface of a wafer during the growth of certain layers. For example, n-type GaN layer 505 is grown over substrate 502 and an active layer 510 is grown over n-type GaN layer 505. In an implementation, UV source 555 does not illuminate the growth surface, i.e., either n-type GaN layer 505 or active layer 510, for example. A p-type GaN layer 515 is grown over active layer 510. During the growth of p-type GaN layer 515, UV source 555 illuminates a growth surface of p-type GaN layer 515 with UV light. UV source 555 may be turned off after growth of p-type GaN layer 515. A tunnel junction n+ type layer 517 is grown over p-type GaN layer 515. During the beginning of the growth of tunnel junction n+ type layer 517, UV source 555 illuminates a growth surface of tunnel junction n+ type layer 517 with UV light. UV source 555 may be turned off after partial growth of tunnel junction n+ type layer 517. In an implementation, window 565 permits UV light from UV source 555 to illuminate the growth surface of a wafer during the growth of all or certain layers.

Figure 6:
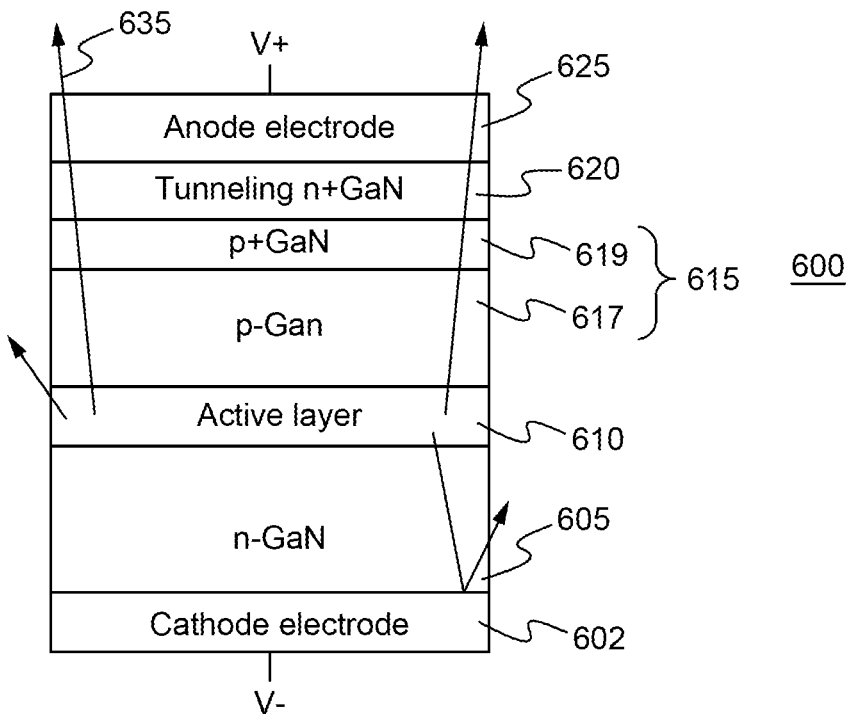
FIG. 6 is an illustrative vertical TJ LED in accordance with certain implementations.

FIG. 6 is an illustrative vertical TJ LED 600 in accordance with certain implementations. TJ LED 600 includes an epitaxially grown n-type GaN layer 605 over a substrate (not shown) and an active layer 610 grown over n-type GaN layer 605. TJ LED 600 further includes p-type GaN layer 615 grown over active layer 610. P-type GaN layer 615 is grown in the presence of light as described herein above. In an implementation, p-type GaN layer 615 includes, but is not limited to, a p-type GaN layer 617 and a tunnel junction p+ GaN layer 619. A tunnel junction n+ GaN layer 620 is formed over p-type GaN layer 615. In an implementation, all layers in TJ LED 600 are grown in the presence of light as described herein. No activation anneal is required to diffuse out the hydrogen and activate the Mg dopants in p-type GaN layer 615 since the Mg dopants are not part of Mg—H complexes and are already active. In an implementation, a doping level for tunnel junction n+ GaN layer 620 is $1 \times 10E20$ cm$^{-3}$, for p+ GaN layer 619 it is $1.5 \times 10E20$ cm$^{-3}$, for p-type GaN layer 617 it is $3 \times 10E18$ cm$^{-3}$, and for n-type GaN layer 605 it is $3 \times 10E18$ cm$^{-3}$.

After epitaxial growth is completed, an anode electrode 625 is formed on tunnel junction n+ GaN layer 620 via metallization. In an implementation, anode electrode 625 may only be around the outer edge or otherwise minimally use the top area since tunnel junction n+ GaN layer 620 is a good current spreader. A carrier wafer is then affixed to the top surface for mechanical support, and the growth substrate is then removed, such as by laser lift-off. Exposed n-type GaN layer 605 is then thinned down, and a reflective cathode electrode 630 is formed on the bottom surface. The wafer is then singulated and packaged to form each TJ LED 600.

Figure 7:
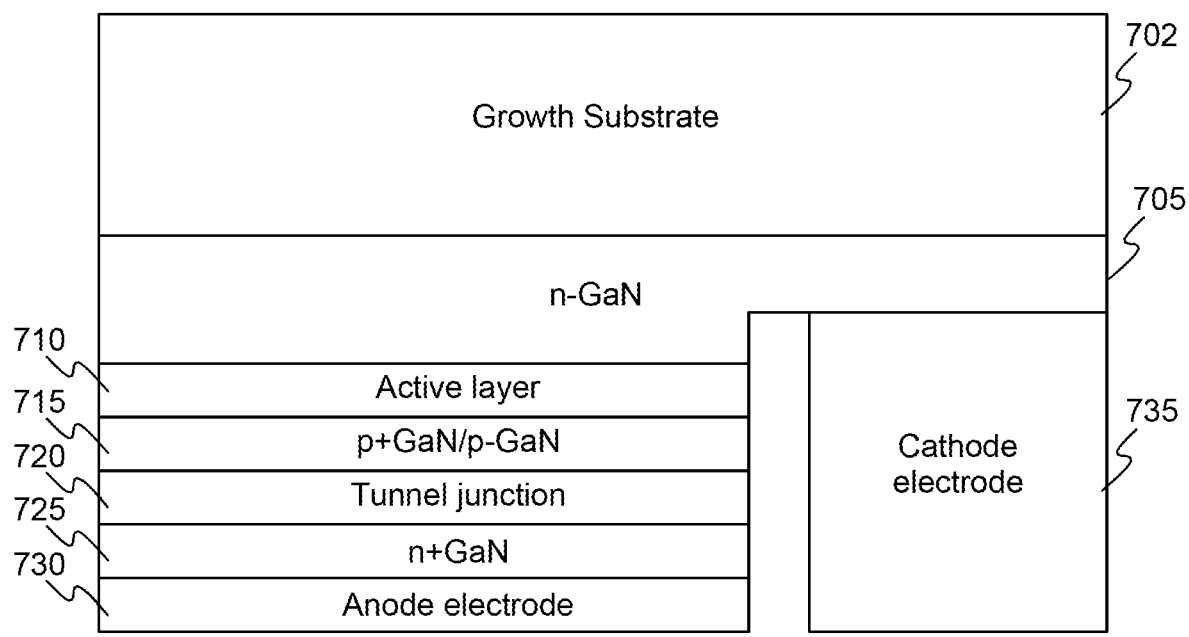
FIG. 7 is an illustrative flip chip TJ LED in accordance with certain implementations.

FIG. 7 is an illustrative flip chip TJ LED 700 in accordance with certain implementations. In general, a tunnel junction 720 is formed at the junction of an underlying n+ GaN layer 725 and an overlying p-type GaN layer 715, where n+ GaN layer 725 is used for better spreading of the current. An n+ GaN layer 725 typically has much lower sheet resistance and hence better current spreading as compared to p-type layers. A metal anode electrode 730 contacts tunnel junction n+ GaN layer 725. N-type GaN layers 705 and 725 are used as contact layers for both the positive and negative terminals of TJ LED 700.

N-type GaN layer 705 is grown on a growth substrate 702 and an active layer 710 is grown on n-type GaN layer 705. N-type GaN layer 705 may include multiple layers of different compositions, dopant concentrations, (including not intentionally doped and/or p-type), and thicknesses. Active layer 710 may comprise multiple thick or quantum well light emitting layers separated by barrier layers. A p-type GaN layer 715 is grown over active layer 710 in the presence of light as described herein. P-type GaN layer 715 may include multiple layers of different compositions, dopant concentrations (including not intentionally doped and/or n-type), and thicknesses. Tunnel junction 720 is formed over p-type GaN layer 715.

In some implementations, tunnel junction 720 includes a highly doped p+ GaN layer, also referred to as a p++ layer, in direct contact with p-type GaN layer 715, and a highly doped n+ GaN layer, also referred to as an n++ layer, in direct contact with the p++ layer. In some implementations, tunnel junction 720 includes a layer of a composition different from the p++ layer and the n++ layer sandwiched between the p++ layer and the n++ layer. In some implementations, tunnel junction 720 includes an Indium gallium nitride (InGaN) layer sandwiched between the p++ layer and the n++ layer. In some implementations, tunnel junction 720 includes an Aluminum nitride (AlN) layer sandwiched between the p++ layer and the n++ layer. Tunnel junction 720 is in direct contact with n+ GaN layer 730, serving as an ohmic contact layer, as described below.

The p++ layer in tunnel junction 720 may be, for example, InGaN or GaN, doped with an acceptor such as Mg or Zn to a concentration of about $10^{18}$ cm$^{-3}$ to about $5 \times 10^{20}$ cm$^{-3}$. In some implementations, the p++ layer is doped to a concentration of about $2 \times 10^{20}$ cm$^{-3}$ to about $4 \times 10^{20}$ cm$^{-3}$. The n++ layer in tunnel junction 720 may be, for example, InGaN or GaN, doped with an acceptor such as Si or Ge to a concentration of about $10^{18}$ cm$^{-3}$ to about $5 \times 10^{20}$ cm$^{-3}$. In some implementations, the n++ layer is doped to a concentration of about $7 \times 10^{19}$ cm$^{-3}$ to about $9 \times 10^{19}$ cm$^{-3}$. Tunnel junction 720 is usually very thin, for example, having a total thickness ranging from about 2 nm to about 100 nm, and each of the p++ layer and the n++ layer may have a thickness ranging from about 1 nm to about 50 nm. In some implementations, each of the p++ layer and the n++ layer may have a thickness ranging from about 25 nm to about 35 nm. The p++ layer and the n++ layer may not necessarily be the same thickness. In an implementation, the p++ layer is 15 nm of Mg-doped InGaN and the n++ layer is 30 nm of Si-doped GaN. The p++ layer and the n++ layer may have a graded dopant concentration. For example, a portion of the p++ layer adjacent to the underlying p-type GaN layer 715 may have a dopant concentration that is graded from the dopant concentration of p-type GaN layer 715 to the desired dopant concentration in the p++ layer. Similarly, the n++ layer may have a dopant concentration that is graded from a maximum adjacent to the p++ layer to a minimum adjacent to n+ GaN layer 725 formed over tunnel junction 720. Tunnel junction 720 is fabricated to be thin enough and doped enough such that tunnel junction 720 displays a low series voltage drop when conducting current in reverse-biased mode. In some implementations, the voltage drop across tunnel junction 720 is about 0.1V to about 1V.

Implementations including an InGaN or AlN or other suitable layer between the p++ layer and the n++ layer may leverage the polarization field in III-nitrides to help align the bands for tunneling. This polarization effect may reduce the doping requirement in the n++ and p++ layers and reduce the tunneling distance required, (potentially allowing higher current flow). The composition of the layer between the p++ layer and the n++ layer may be different from the composition of the p++ layer and the n++ layer, and/or may be selected to cause band re-alignment due to the polarization charge that exists between dissimilar materials in the III-nitride material system. Examples of suitable tunnel junctions are described in U.S. Pat. No. 8,039,352, which is incorporated herein by reference. Vertical TJ LED 600 of FIG. 6 may be formed in the same way as TJ LED 700.

A n+ GaN layer 725 is formed over tunnel junction 720, in direct contact with the n++ layer, for use as an ohmic contact layer. A metal anode electrode 730 is formed on n+ GaN layer 725. A mesa is etched to expose n-GaN layer 705, and a metal cathode electrode 735 is formed on the exposed part of n-GaN layer 705.

Figure 8:
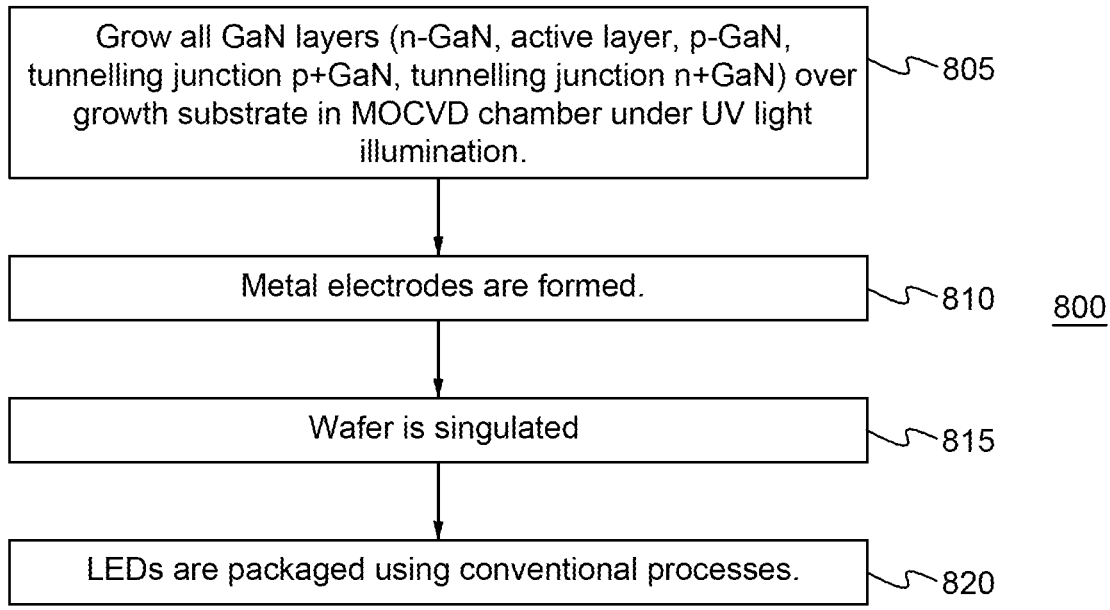
FIG. 8 is an illustrative method for making the TJ LED of FIGS. 6 and 7 in accordance with certain implementations.

FIG. 8 is an illustrative method 800 that uses UV illumination during growth of certain epitaxial layers in TJ LED 600 of FIG. 6, TJ LED 700 of FIG. 7 and other devices where a p-type GaN layer is buried so as to make it difficult to diffuse out hydrogen. All GaN layers, including but not limited to, n-type GaN layer, active layer, p-type GaN layer, tunnel junction p+ GaN layer, and tunnel junction n+ GaN layer, are grown on a substrate in a MOCVD chamber under UV illumination or light having a photon energy higher than the p-type layer's band gap energy to inhibit formation of Mg—H complexes within the III-nitride p-type layer resulting from hydrogen present in the MOCVD chamber (805). Metal electrodes are formed (810), the wafer is singulated (815), and the LEDs are packaged (820). For a vertical LED implementation, the growth substrate may be removed to expose the n-GaN cathode layer as shown in FIG. 6. For a flip chip LED implementation, a mesa may be etched to expose the n-GaN cathode layer for contact by the cathode electrode, so the growth substrate may remain as shown in FIG. 7.

Figure 9:
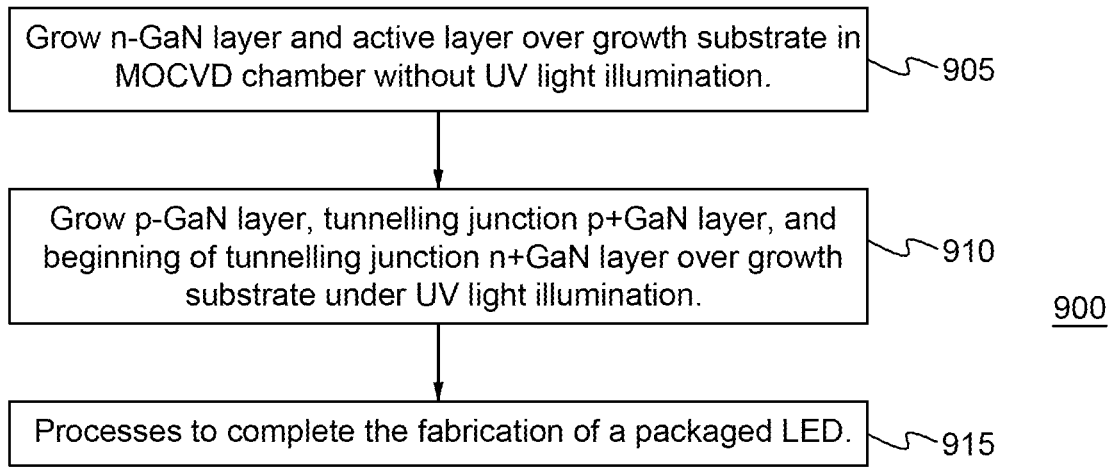
FIG. 9 is another illustrative method for making the TJ LED of FIGS. 6 and 7 in accordance with certain implementations.

FIG. 9 is another illustrative method 900 that uses UV illumination during growth of certain epitaxial layers in TJ LED 600 of FIG. 6, TJ LED 700 of FIG. 7 and other devices where a p-type GaN layer is buried so as to make it difficult to diffuse out hydrogen. A n-GaN layer and active layer are grown over a growth substrate without being illuminated by an UV light (905). The UV light is turned on to illuminate the wafer during the growth of all p-type GaN layers, including any p++ layer in the tunnel junction shown in FIG. 7, as well as at the beginning of the tunnel junction n+ GaN layer, including any n++ layer in the tunnel junction (910). The UV illumination prevents new hydrogen from the growth of the tunnel junction n+ GaN layer from diffusing into the p-type GaN layers to form Mg—H complexes near the tunnel junction. Processes may then be performed to complete the fabrication of a packaged TJ LED as shown, for example, in blocks 810-820 of FIG. 8 (915).

Figure 10:
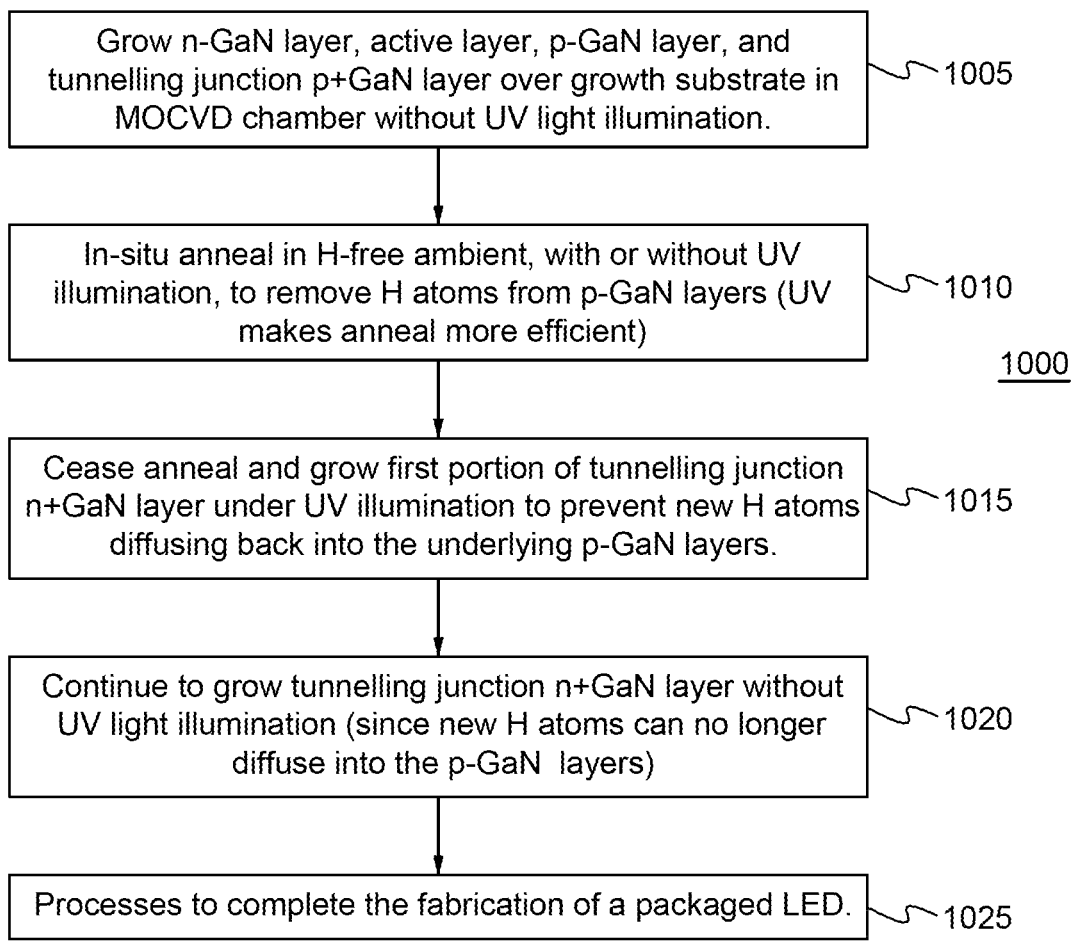
FIG. 10 is another illustrative method for making the TJ LED of FIGS. 6 and 7 in accordance with certain implementations.

FIG. 10 is another illustrative method 1000 that uses UV illumination during growth of certain epitaxial layers in TJ LED 600 of FIG. 6, TJ LED 700 of FIG. 7 and other devices where a p-type GaN layer is buried so as to make it difficult to diffuse out hydrogen. N-type GaN layer, active layer, and all p-type GaN layers, including any p++ layer in the tunnel junction as shown in FIG. 7, are grown over a growth substrate without being illuminated by an UV light (1005). An in-situ anneal (in a MOCVD chamber) is performed in a non-hydrogen environment to diffuse out the hydrogen atoms from all of the p-type GaN layers to activate the Mg dopants (1010). In an implementation, UV illumination is used to make the anneal process more efficient.

Anneal process is stopped, and the tunnel junction n+ GaN layer, including any n++ layer in the tunnel junction as shown in FIG. 7, is grown under UV light up to a certain thickness (1015). This prevents new hydrogen present during the growth of the n+ GaN layer from diffusing into the p-type GaN layers and forming Mg—H complexes.

The UV light is turned off, and the remainder of the tunnel junction n+ GaN layer is grown (1020). New H atoms can no longer diffuse into the buried p-type GaN layers through the partially grown tunnel junction n+ GaN layer. Processes may then be performed to complete the fabrication of a packaged TJ LED as shown, for example, in blocks 810-820 of FIG. 8 (1025).

The methods described herein are also applicable to fabrication of other LEDs in situations where the p-GaN layers are buried under another layer, such as if the p-type GaN layers were first grown over a substrate followed by the active layer, and the like. This is illustrated in the light emitting devices shown in FIGS. 11 and 12.

Figure 11:
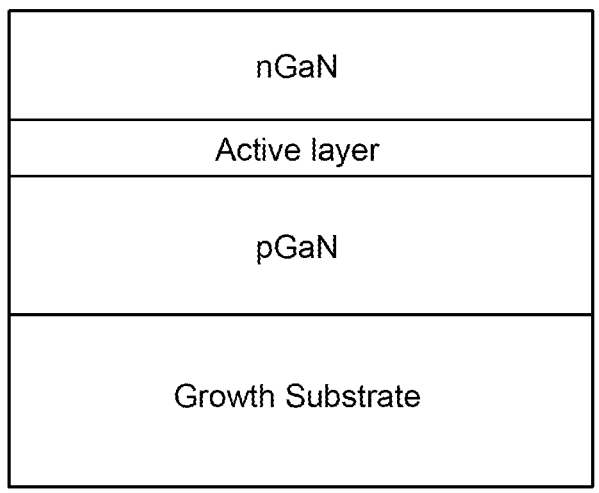
FIG. 11 is an illustrative light emitting device with a p-type GaN down structure in accordance with certain implementations.

FIG. 11 is an illustrative LED 1100 with a p-type GaN down structure in accordance with certain implementations. LED 1100 includes an epitaxially grown p-type GaN layer 1110 over a substrate 1105. An active layer 1115 is grown over p-type GaN layer 1110 and an n-type GaN layer 1120 is grown over active layer 1115.

Figure 12:
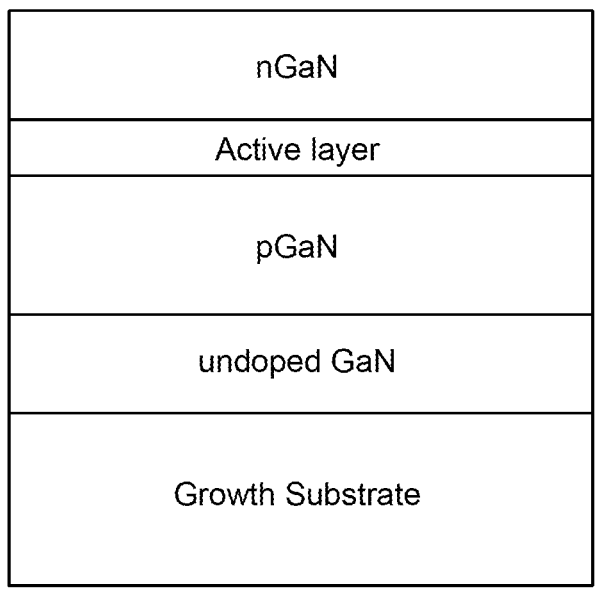
FIG. 12 is another illustrative light emitting device with a p-type GaN down structure in accordance with certain implementations.

FIG. 12 is another illustrative LED 1200 with a p-type GaN down structure in accordance with certain implementations. LED 1200 includes an epitaxially grown undoped layer 1210 grown over a substrate 1205. A p-type GaN layer 1215 is then grown over undoped layer 1210, an active layer 1220 is grown over p-type GaN layer 1215 and an n-type GaN layer 1225 is grown over active layer 1220.

Figure 13:
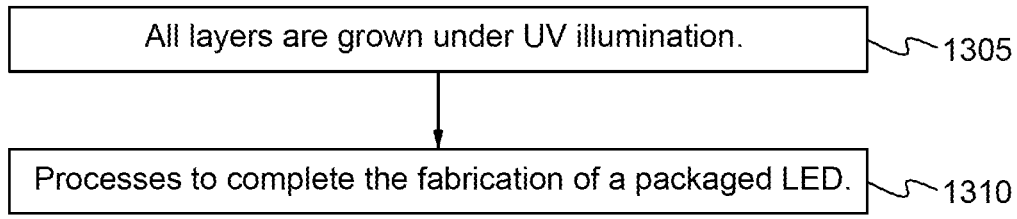
FIG. 13 is an illustrative method for making the light emitting devices of FIGS. 11 and 12 in accordance with certain implementations.

FIG. 13 is an illustrative method 1300 for making the light emitting devices of FIGS. 11 and 12 in accordance with certain implementations. All GaN layers, including but not limited to, p-type GaN layer, active layer, n-type GaN layer, and undoped GaN layer are grown on a substrate in a MOCVD chamber under UV illumination or light having a photon energy higher than the p-type layer's band gap energy to inhibit formation of Mg—H complexes within the III-nitride p-type layer resulting from hydrogen present in the MOCVD chamber (1105). Processes may then be performed to complete the fabrication of a packaged LED as shown, for example, in blocks 810-820 of FIG. 8 (1110).

Figure 14:
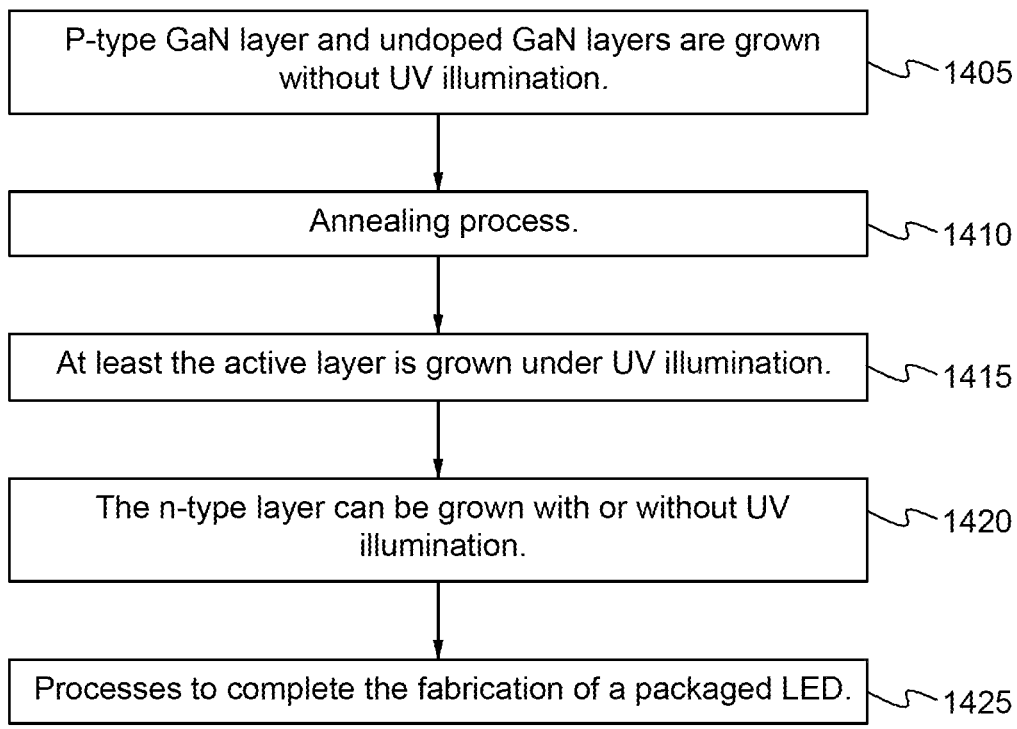
FIG. 14 is an illustrative method for making light emitting devices of in accordance with certain implementations.

FIG. 14 is an illustrative method 1400 for making light emitting devices of in accordance with certain implementations. P-type GaN layers and undoped GaN layers are grown on a substrate in a MOCVD chamber without UV illumination (1405). An in-situ anneal (in a MOCVD chamber) is performed in a non-hydrogen environment to diffuse out the hydrogen atoms from all of the p-type GaN layers to activate the Mg dopants (1410). In an implementation, UV illumination is used to make the anneal process more efficient. Anneal process is stopped, and at least the active layer is then grown under UV illumination as described herein (1415). In an implementation, a first portion of the active layer is grown under UV illumination and a remainder is grown without UV illumination. The n-type layer can be grown with or without UV illumination (1420) as the p-type GaN layer is buried under the active layer. Processes may then be performed to complete the fabrication of a packaged LED as shown, for example, in blocks 810-820 of FIG. 8 (1425).

The methods described herein enable fabrication of vertically stacked LEDs to create a die of LEDs in a serial string to obtain a desired forward voltage. In an implementation, this stack of LEDs may terminate with a p-type GaN layer contacted by a metal anode electrode.

Although the implementations and examples described herein use GaN as an example, the methods are applicable to all III-nitride processes and materials.

The substrate is often sapphire but may be any suitable substrate such as, for example, SiC, Si, GaN, or a composite substrate. A surface of substrate on which a III-nitride semiconductor structure is grown may be patterned, roughened, or textured before growth, which may improve light extraction from the LED.

In general, a method for forming a light emitting diode (LED) in a deposition chamber includes epitaxially growing a III-nitride p-type layer, epitaxially growing a non p-type layer over the III-nitride p-type layer under illumination, and illuminating a surface of the non p-type layer with light having a photon energy higher than the III-nitride p-type layer's band gap energy during an initial growth period to inhibit formation of Mg—H complexes within the III-nitride p-type layer resulting from hydrogen present in the deposition chamber. In an implementation, the light is provided through a window in the deposition chamber. In an implementation, the deposition chamber is a MOCVD chamber. In an implementation, the light is ultraviolet light or a higher energy light. In an implementation, the non p-type layer is an active layer. In an implementation, the non p-type layer is a III-nitride n-type layer. In an implementation, the illuminating the surface of the non p-type layer with the light remains on for an entire growth period of the non p-type layer. In an implementation, the III-nitride p-type layer is a tunnel junction III-nitride p-type layer and the non p-type layer is a III-nitride tunnel junction n-type layer, and further includes epitaxially forming the tunnel junction III-nitride p-type layer and the III-nitride tunnel junction n-type layer under illumination. In an implementation, the III-nitride p-type layer is a tunnel junction III-nitride p-type layer and the non p-type layer is a III-nitride tunnel junction n-type layer, and further includes epitaxially forming a portion of the III-nitride tunnel junction n-type layer under illumination. In an implementation, the method further includes epitaxially forming a remainder of the III-nitride tunnel junction n-type layer absent light illumination. In an implementation, the method further includes annealing the tunnel junction III-nitride p-type layer prior to the epitaxially growing a portion of the III-nitride tunnel junction n-type layer under illumination.

In general, a method for forming a light emitting diode (LED) in a deposition chamber includes epitaxially growing a III-nitride n-type layer over a growth substrate, epitaxially growing an active layer over the III-nitride n-type layer and epitaxially growing a III-nitride p-type layer over the active layer in the presence of hydrogen and magnesium. The III-nitride p-type layer is annealed in-situ to activate magnesium dopants in the p-type layer. The annealing is then ceased. The method further includes epitaxially forming a first portion of a III-nitride tunnel junction n-type layer over the III-nitride p-type layer to form a tunnel junction light emitting diode, illuminating a surface of the first portion of the III-nitride tunnel junction n-type layer with light having a photon energy higher than the III-nitride p-type layer's band gap energy during growth and epitaxially forming a remainder of the III-nitride tunnel junction n-type layer absent light illumination during growth. Illuminating the surface of the III-nitride tunnel junction n-type layer with the light inhibits the formation of Mg—H complexes within the III-nitride p-type layer. In an implementation, the light is UV light. In an implementation, the method further includes applying the light through a window in the deposition chamber. In an implementation, the method further includes illuminating with the light during the annealing.

In general, a method for forming a light emitting diode (LED) in a deposition chamber includes epitaxially growing at least one III-nitride p-type layer over a growth substrate absent light illumination during growth, epitaxially growing a non p-type layer over the at least one III-nitride p-type layer, and illuminating a surface of the non p-type layer with light having a photon energy higher than the III-nitride p-type layer's band gap energy during non p-type layer growth to inhibit formation of Mg—H complexes within the III-nitride p-type layer resulting from hydrogen present in the deposition chamber. In an implementation, the at least one non p-type layer is at least one of a III-nitride n-type layer and an active layer. In an implementation, the illuminating the surface of the non p-type layer with light is stopped after an initial growth of the non p-type layer. In an implementation, a remaining growth of the non p-type layer is done absent light illumination.

The above growth techniques are illustrative and combinations of the above described growth techniques for p-type layers, active layers and n-type layers are within the scope of the description and claims.

Any of the devices described herein may be combined with a wavelength converting structure. The wavelength converting structure may contain one or more wavelength converting materials. The wavelength converting structure may be directly connected to the LED, disposed in close proximity to the LED but not directly connected to the LED, or spaced apart from the LED. The wavelength converting structure may be any suitable structure. The wavelength converting structure may be formed separately from the LED, or formed in situ with the LED. Examples of wavelength converting structures that are formed separately from the LED include ceramic wavelength converting structures that may be formed by sintering or any other suitable process, wavelength converting materials such as powder phosphors that are disposed in transparent material such as silicone or glass that is rolled, cast, or otherwise formed into a sheet, then singulated into individual wavelength converting structures, and wavelength converting materials such as powder phosphors that are disposed in a transparent material such as silicone that is formed into a flexible sheet, which may be laminated or otherwise disposed over an LED.

Examples of wavelength converting structures that are formed in situ include wavelength converting materials such as powder phosphors that are mixed with a transparent material such as silicone and dispensed, screen printed, stenciled, molded, or otherwise disposed over the LED; and wavelength converting materials that are coated on the LED by electrophoretic, vapor, or any other suitable type of deposition.

Multiple forms of wavelength converting structure can be used in a single device. For example, a ceramic wavelength converting member can be combined with a molded wavelength converting member, with the same or different wavelength converting materials in the ceramic and the molded members.

The wavelength converting structure may include, for example, conventional phosphors, organic phosphors, quantum dots, organic semiconductors, II-VI or III-V semiconductors, II-VI or III-V semiconductor quantum dots or nanocrystals, dyes, polymers, or other materials that luminesce.

The wavelength converting material absorbs light emitted by the LED and emits light of one or more different wavelengths. Unconverted light emitted by the LED is often part of the final spectrum of light extracted from the structure, though it need not be. Examples of common combinations include a blue-emitting LED combined with a yellow-emitting wavelength converting material, a blue-emitting LED combined with green- and red-emitting wavelength converting materials, a UV-emitting LED combined with blue- and yellow emitting wavelength converting materials, and a UV-emitting LED combined with blue-, green-, and red-emitting wavelength converting materials. Wavelength converting materials emitting other colors of light may be added to tailor the spectrum of light extracted from the structure.

The implementations described herein may be incorporated into any suitable light emitting device. Implementations of the invention are not limited to the particular structures illustrated, such as, for example, the vertical device of FIG. 6 or the flip chip device of FIG. 7.

Though in the examples and implementations described above the LED is a III-nitride LED that emits blue or UV light, light emitting devices besides LEDs, such as laser diodes, are within the scope of the invention. In addition, the principles described herein may be applicable to semiconductor light emitting devices made from other materials systems such as other III-V materials, III-phosphide, III-arsenide, II-VI materials, ZnO, or Si-based materials.

The non-limiting methods described herein for using UV illumination during the growth of certain layers may be modified for a variety of applications and uses while remaining within the spirit and scope of the claims. The implementations and variations described herein, and/or shown in the drawings, are presented by way of example only and are not limiting as to the scope and spirit. The descriptions herein may be applicable to all implementations of the methods for using UV illumination during the growth of certain layers although it may be described with respect to a particular implementation.

As described herein, the methods described herein are not limited to any particular element(s) that perform(s) any particular function(s) and some steps of the methods presented need not necessarily occur in the order shown. For example, in some cases two or more method steps may occur in a different order or simultaneously. In addition, some steps of the described methods may be optional (even if not explicitly stated to be optional) and, therefore, may be omitted. These and other variations of the methods disclosed herein will be readily apparent, especially in view of the description of the methods for using UV illumination during the growth of certain layers as described herein, and are considered to be within the full scope of the invention.

Some features of some implementations may be omitted or implemented with other implementations. The device elements and method elements described herein may be interchangeable and used in or omitted from any of the examples or implementations described herein.

Although features and elements are described above in particular combinations, each feature or element can be used alone without the other features and elements or in various combinations with or without other features and elements.

What is claimed is:

1. A method for forming a light emitting diode (LED), the method comprising:
   epitaxially growing a III-nitride n-type layer over a growth substrate;
   epitaxially growing an active layer over the III-nitride n-type layer;
   epitaxially growing a III-nitride p-type layer over the active layer in the presence of hydrogen and magnesium;
   annealing at least the III-nitride p-type layer in situ to activate magnesium dopants in the III-nitride p-type layer;
   ceasing the anneal;
   epitaxially forming a first portion of a III-nitride tunnel junction n-type layer over the III-nitride p-type layer to form a tunnel junction light emitting diode;
   illuminating a surface of the first portion of the III-nitride tunnel junction n-type layer with light having a photon energy higher than the III-nitride p-type layer's band gap energy during growth; and
   epitaxially forming a remainder of the III-nitride tunnel junction n-type layer absent light illumination during growth.

2. The method of claim 1, wherein illuminating the surface of the III-nitride tunnel junction n-type layer with the light inhibits the formation of Mg—H complexes within the III-nitride p-type layer.

3. The method of claim 2, wherein the light is UV light.

4. The method of claim 1, further comprising:
   applying the light through a window in a deposition chamber.

5. The method of claim 4, wherein the deposition chamber is a MOCVD chamber.

6. The method of claim 1, further comprising:
   illuminating with the light during the annealing.

* * * * *